United States Patent [19]

Matsushita

[11] Patent Number: 5,365,488
[45] Date of Patent: Nov. 15, 1994

[54] DATA READING CIRCUIT HAVING A CLAMPING CIRCUIT FOR CLAMPING A PAIR OF DATA BUSES TO PREDETERMINED POTENTIALS

[75] Inventor: Yuichi Matsushita, Miyazaki, Japan

[73] Assignee: Oki Electric Industry Co., Ltd., Tokyo, Japan

[21] Appl. No.: 70,239

[22] Filed: Jun. 2, 1993

[30] Foreign Application Priority Data

Jun. 5, 1992 [JP] Japan .................................. 4-145188

[51] Int. Cl.$^5$ ............................................. G11C 7/00
[52] U.S. Cl. .......................... 365/226; 365/189.01; 365/189.06; 365/190; 365/203
[58] Field of Search ............ 365/226, 203, 204, 189.06, 365/189.09, 190, 189.01

[56] References Cited

U.S. PATENT DOCUMENTS

| | | | |
|---|---|---|---|
| 3,978,459 | 8/1976 | Koo ........................................ | 365/203 |
| 4,677,311 | 5/1987 | Ul Haq et al. ........................ | 365/190 |
| 5,091,886 | 2/1992 | Miyawaki et al. ..................... | 365/109.06 |
| 5,151,878 | 9/1992 | Yamada et al. ...................... | 365/189.01 |

FOREIGN PATENT DOCUMENTS 63-166090 7/1988 Japan .

*Primary Examiner*—Eugene R. LaRoche
*Assistant Examiner*—Tan Nguyen
*Attorney, Agent, or Firm*—Steven M. Rabin

[57] ABSTRACT

A data reading circuit of the present invention comprises a pair of data buses supplied with complementary potentials respectively, a first reference voltage source having a first potential, a second reference voltage source having a second potential, a first switch connected to the first reference voltage source and the pair of data buses and responsive to a first clamping signal thereby to electrically connect the first reference voltage source to the pair of data buses, and a second switch connected to the second reference voltage source and the pair of data buses and responsive to a second clamping signal thereby to electrically connect the second reference voltage source to the pair of data buses.

20 Claims, 2 Drawing Sheets

DATA READING CIRCUIT HAVING A CLAMPING CIRCUIT FOR CLAMPING A PAIR OF DATA BUSES TO PREDETERMINED POTENTIALS

CROSS REFERENCE TO RELATED APPLICATION

This application claims the priority of Japanese Patent Application Ser. No. 4-145,188, filed Jun. 5, 1992, the subject matter of which is incorporated herein by reference.

BACKGROUND OF THE INVENTION

The present invention relates to a data reading circuit including a circuit for equalizing potentials applied to a pair of data buses for the transfer of data with each other, and particularly to a technique for adjusting an equalizing with each other voltage for equalizing potentials applied to a pair of data buses.

As a data reading circuit including a circuit for equalizing potentials applied to a pair of data buses (a pair of bit lines) with each other, there is known one which has been disclosed in Japanese Laid-Open Patent Publication No. 63-166090, for example.

The disclosed data reading circuit has an equalizing circuit for precharging each of a pair of bit lines to about a VDD level in response to a precharge signal and for equalizing potentials applied to the pair of bit lines with each other, and two pull-up transistors for supplying about VDD levels to the pair of bit lines respectively at all times.

The two pull-up transistors prevent the difference between the potential applied to one of the pair of bit lines and the potential applied to the other thereof from excessively increasing.

SUMMARY OF THE INVENTION

It is an object of the present invention to equalize potentials applied to a pair of data buses for the transfer of data with each other.

It is another object of the present invention to read data stored in memory cells into a pair of data buses at a higher speed.

It is a further object of the present invention to adjust an equalize potential applied to each of a pair of data buses.

According to one aspect of the present invention, for achieving the above objects, there is provided a data reading circuit comprises a pair of data buses supplied with complementary potentials respectively; a first reference power source having a first potential; a second reference power source having a second potential; a first switch connected to the first reference power source and the pair of data buses and responsive to a first clamping signal thereby to electrically connect the first reference power source to the pair of data buses; and a second switch connected to the second reference power source and the pair of data buses and responsive to a second clamping signal thereby to electrically connect the second reference power source to the pair of data buses.

DETAILED DESCRIPTION OF THE PREFERRED EMBODIMENTS

One embodiment of the present invention will hereinafter be described with reference to FIG. 1.

Figure 1:
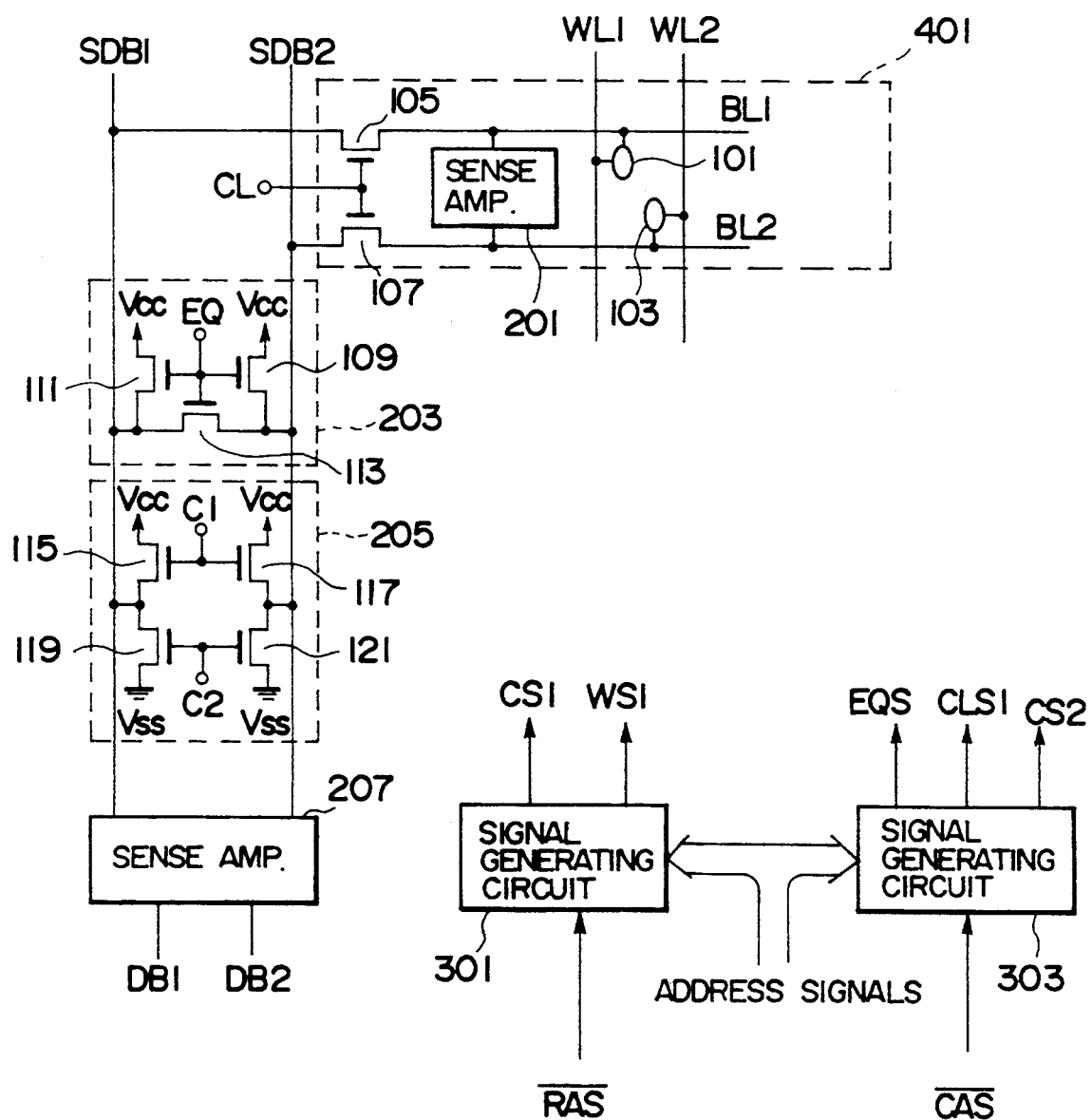
FIG. 1 is a circuit diagram showing a data reading circuit according to one embodiment of the present invention.

FIG. 1 is a circuit diagram showing a data reading circuit according to one embodiment of the present invention.

FIG. 1 shows one example in which the present invention is applied to a dynamic random access memory (DRAM).

The DRAM includes a memory array 401. The memory array 401 has a memory cell 101 provided at a position where a word line WL1 and a bit line BL1 intersect, and a memory cell 103 provided at a position where a word line WL2 and a bit line BL2 intersect. Predetermined data are stored in the memory cells 101 and 103 respectively.

The bit line BL1 and the bit line BL2 form a pair of complementary bit lines. The pair of bit lines BL1 and BL2 is electrically connected to a sense amplifier 201 and transfer gates 105 and 107.

The transfer gate 105 is electrically connected between a sub data bus SDB1 and the bit line BL1. The transfer gate 107 is electrically connected between a sub data bus SDB2 and the bit line BL2. The transfer gates 105 and 107 are made up of N-type MOS transistors each of which turns on and off in response to a column selection signal supplied to a column selection signal input terminal CL.

The sub data buses SDB1 and SDB2 constitute a pair of complementary sub data buses. The pair of sub data buses is electrically connected with a plurality of memory cells identical in configuration to those in the memory array 401. Only one memory cell is shown in FIG. 1 for the sake of brevity of illustration.

The pair of sub data buses is electrically connected with an equalizing circuit 203, a clamping circuit 205 and a sense amplifier 207. The sense amplifier 207 is electrically connected to main data buses DB1 and DB2 respectively corresponding to the sub data buses SDB1 and SDB2. The main data buses DB1 and DB2 form a pair of complementary main data buses.

The equalizing circuit 203 comprises N-type MOS transistors 109, 111 and 113. The MOS transistor 109 has a gate electrode electrically connected to an equalize signal input terminal EQ, a drain electrode supplied by a first reference voltage source with a first potential or power source potential VCC and a source electrode electrically connected to the sub data bus SDB2. The MOS transistor 111 has a gate electrode electrically connected to the equalize signal input terminal EQ, a drain electrode supplied with the power source potential VCC and a source electrode electrically connected to the sub data bus SDB1. The MOS transistor 113 has a gate electrode electrically connected to the equalize signal input terminal EQ, a drain electrode electrically connected to the sub data bus SDB1 and a source electrode electrically connected to the sub data bus SDB2. The gate electrodes of the MOS transistors 109, 111 and 113 are supplied with an equalize signal given to the equalize signal input terminal EQ.

The equalizing circuit 203 supplies the power source potential VCC to the pair of sub data buses in response to the activation of the equalize signal so as to equalize the potential which has appeared on or has been applied to the sub data bus SDB1 and the potential applied to the sub data bus SDB2.

The clamping circuit 205 comprises a pull-up transistor comprised of N-type MOS transistors 115 and 117 and a pull-down transistor comprised of N-type MOS transistors 119 and 121.

The MOS transistor 115 has a gate electrode electrically connected to a first clamping signal input terminal C1, a drain electrode supplied with the power source potential VCC and a source electrode electrically connected to the sub date bus SDB1. The MOS transistor 117 has a gate electrode electrically connected to the first clamping signal input terminal C1, a drain electrode supplied with the power source potential VCC and a source electrode electrically connected to the sub data bus SDB2. The MOS transistor 119 has a gate electrode electrically connected to a second clamping signal input terminal C2, a source electrode connected to a second reference voltage source, in this case ground, so as to be supplied with a second potential, in this case a ground potential VSS, and a drain electrode electrically connected to the source electrode of the MOS transistor 115. The MOS transistor 121 has a gate electrode electrically connected to the second clamping signal input terminal C2, a source electrode supplied with the ground potential VSS and a drain electrode electrically connected to the source electrode of the MOS transistor 117.

Next, the clamping circuit 205 supplies the power source potential VCC to the pair of sub data buses in response to the activation of a first clamping signal. Further, the clamping circuit 205 supplies the ground potential VSS to the pair of sub data buses in response to the activation of a second clamping signal. That is, the clamping circuit 205 prevents the difference in potential between the sub data bus SDB1 and the sub data bus SDB2 from increasing and adjusts an equalize voltage or potential applied to each of the pair of sub data buses.

In order to adjust the equalize voltages on the pair of sub data buses, the dimension ratio of the MOS transistor 115, e.g., a W/L ratio is set to about 7.5, whereas the dimension ratio of the MOS transistor 119, e.g., a W/L ratio is set to about 0.75.

The DRAM also has signal generating circuits 301 and 303.

The signal generating circuit 301 receives one of address signals therein and outputs both a word line selection signal (e.g., WS1 when the memory cell 101 is selected) for selecting a word line corresponding to the received address signal and a first clamping signal CS1 in response to a RAS signal (Row Address Strobe Signal).

The signal generating circuit 303 has an address transition detector for detecting the transition of an input address signal. Further, the signal generating circuit 303 receives one of the address signals and a CAS signal (Column Address Strobe Signal) therein and outputs an equalize signal EQS and a second clamping signal CS2 therefrom. After the equalize signal EQS has been output from the signal generating circuit 303, the signal generating circuit 303 outputs a column selection signal (e.g., CLS1 when either the memory cell 101 or the memory cell 103 is selected) for selecting a pair of bit lines corresponding to the input address signal.

The data reading operation of the DRAM shown in FIG. 1 will now be described below with reference to FIG. 2.

Figure 2:
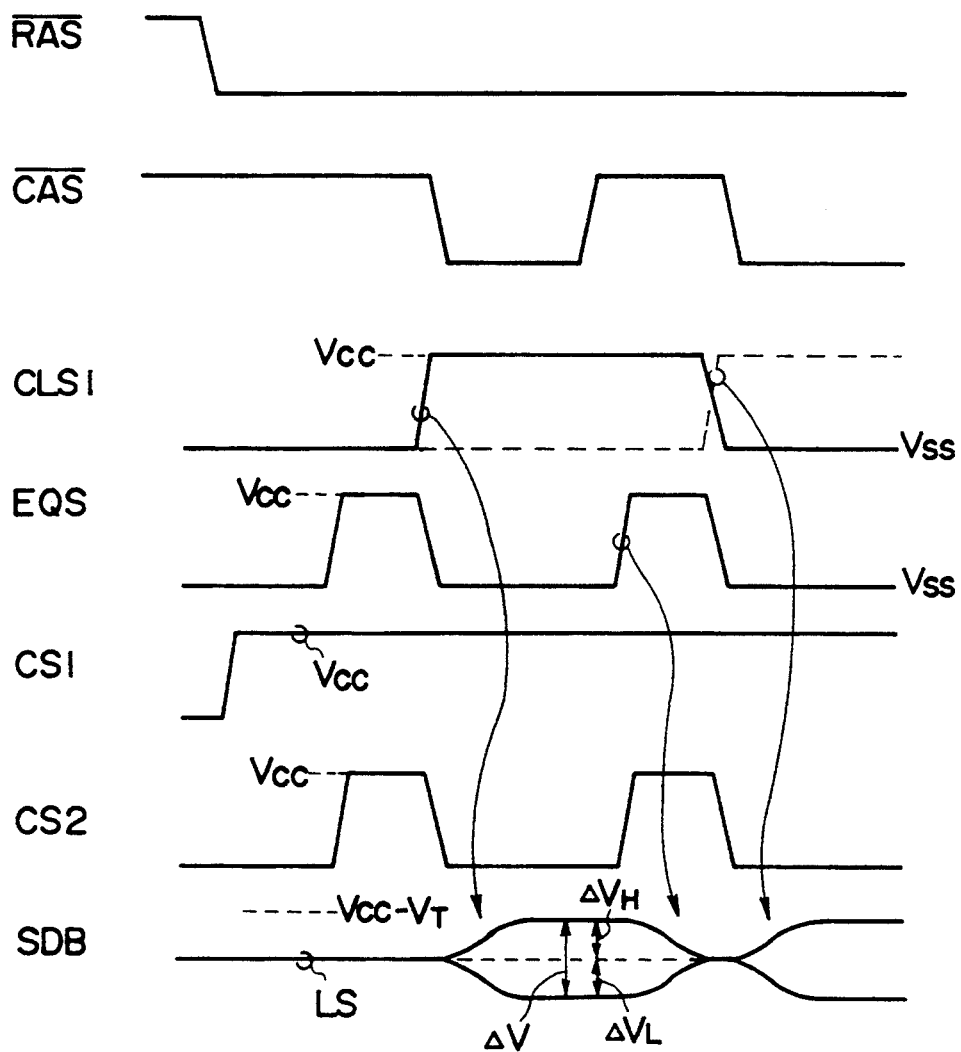
FIG. 2 is a timing chart for describing the operation of the data reading circuit shown in FIG. 1.

FIG. 2 is a timing chart for described the operation of the data reading circuit according to the present invention.

When the RAS signal falls, the signal generating circuit 301 latches therein one address signal for selecting a word line and outputs therefrom a word line selection signal WS1 and a first clamping signal CS1 each of which is a VCC level. When the word line WL1 is selected, all the memories electrically connected to the selected word line WL1 are selected (only the memory cell 101 is shown in FIG. 1). As a result, the data stored in all the memory cells electrically connected to the word line WL1 are read into the pair of bit lines (only the bit lines BL1 and BL2 are shown in FIG. 1). At this time, the sense amplifier 207 is operated to set the potential applied to one of the pair of bit lines to the power source potential VCC and set the potential applied to the other thereof to the ground potential VSS (the potentials on the bit lines BL1 and BL2 will hereinafter be described as being the power source potential VCC and the ground potential VSS respectively). That is, the differences in potential between ones of the respective pairs of bit lines and the others of the pairs of bit lines are respectively represented as about VCC.

When the first clamping signal is brought to the VCC level, the MOS transistors 115 and 117 are turned on so as to supply the power source potential VCC to the sub data buses SDB1 and SDB2.

The signal generating circuit 303 detects a variation in the input address signal and outputs therefrom both the equalize signal EQS and the second clamping signal CS2 of the VCC level based on the result of detection. When the equalize signal EQS is brought to the VCC level, the MOS transistors 109, 111 and 113 are turned on so as to supply the power source potential VCC to the sub data buses SDB1 and SDB2 and to equalize the potential applied to the sub data bus SDB1 with that applied to the sub data bus SDB2.

When the second clamping signal CS2 is brought to the VCC level, the MOS transistors 119 and 121 are turned on so as to supply the ground potential VSS to the sub data buses SDB1 and SDB2. As a result, the respective potentials applied to the sub data buses SDB1 and SDB2 are lowered from the source power potential VCC to the ground potential VBS. Finally, each of the potentials applied to the sub data buses SDB1 and SDB2 is fixed to a potential LS as shown in FIG. 2. This potential LS represents the optimum potential for starting the operation of the sense amplifier 207. The potential LS is determined by the dimensions of the pull-up transistors 115 and 117 and the dimensions of the pull-down transistors 119 and 121.

After a predetermined time interval has elapsed since the equalize signal EQS has been brought to the VCC level, the column selection signal CLS1 for selecting the memory array 401 is brought to the VCC level and at the same time the equalize signal EQS and the second clamping signal CS2 fall to the VSS level. When the column selection signal CLS1 rises to the VCC level, the transfer gates 105 and 107 are turned on. Therefore, the potential applied to the sub data bus SDB1 starts to change into the power source potential VCC and the potential applied to the sub data bus SDB2 starts to change into the ground potential VSS. During a period in which the equalize signal EQS and the second clamping signal CS2 are being reduced to the VSS level, a potential difference $\Delta V$ is finally produced between the sub data bus SDB1 and the sub data bus SDB2. At this time, the potential on the sub data bus SDB1 is brought to a potential increased by $\Delta V_H$ from the potential LS for starting the operation of the sense amplifier 207 to the power source potential VCC, whereas the potential on the sub data bus SDB2 is brought to a potential decreased by $\Delta V_L$ from the operation start potential LS to the ground potential VSS (the potential applied to the sub data bus SDB1 is actually represented as a potential obtained by subtracting a threshold voltage $V_T$ of the MOS transistor 105 from the power source potential VCC). Described specifically, the power source potential VCC is about 3.3 V, the potential LS is about 2.0 V, $\Delta V_H$ and $\Delta V_L$ are respectively 0.5 V and $V_T$ is about 1 V.

The potentials to be applied to the sub data buses SDB1 and SDB2 can be rapidly fixed by setting the potential LS to the center between the power source potential VCC and the ground potential VSS. That is, the data stored in the memory cell can be more rapidly transferred to the corresponding sub data buses SDB1 and SDB2.

The setting of the potential LS can be realized by suitably setting the dimensions of the pull-up transistors 115 and 117 and the dimensions of the pull-down transistors 119 and 121.

The potentials applied to the sub data buses SDB1 and SDB2 are amplified by the sense amplifier 207 and output to their corresponding main data buses DB1 and DB2. The complementary potentials, which have appeared on the main data buses DB1 and DB2, represent the data stored in the memory cell 101.

Next, when the input address signal varies again and a memory cell other than the memory cell which has been selected at present, is selected, the signal generating circuit 303 outputs both the equalize signal EQS and the second clamping signal CS2 of the VCC level again therefrom. When the equalize signal EQS is brought to the VCC level, the MOS transistors 109, 111 and 113 are turned on. Therefore, the power source potential VCC is supplied to the sub data buses SDB1 and SDB2 and at the same time the potential on the sub data bus SDB1 and the potential on the sub data bus SDB2 are equalized with each other.

When the second clamping signal CS2 is brought to the VCC level, the MOS transistors 119 and 121 are turned on so as to supply the ground potential VSS to the sub data buses SDB1 and SDB2. As a result, the potentials applied to the sub data buses SDB1 and SDB2 are lowered from the power source potential VCC to the ground potential VSS. Each of the potentials on the sub data buses SDB1 and SDB2 is finally fixed to the potential LS as shown in FIG. 2.

Since the difference between the potential applied to the sub data bus SDB1 and the potential LS is equal to the difference between the potential applied to the sub data bus SDB2 and the potential LS, the potentials applied to the sub data buses SDB1 and SDB2 are promptly fixed to the potential LS.

After a predetermined time interval has elapsed since the equalize signal EQS has been brought to the VCC level, a column selection signal CLS1 for selecting one memory cell other than the memory cells in the memory array 401 is brought to the VCC level (indicated by the broken line in FIG. 2) and at the same time the equalize signal EQS and the second clamping signal CS2 fall into the VSS level.

Since the memory cells in the memory array 401 are not selected in this case, the column selection signal CLS1 for selecting the memory array 401 falls to the VSS level as indicated by the solid line in FIG. 2.

When the column selection signal CLS1 for selecting one memory cell other than the memory cells in the memory array 401 rises to the VCC level, the transfer gates 105 and 107 are turned on. Therefore, the potential on either the sub data bus SDB1 or SDB2 begins to change into the power source potential VCC. Further, the potential on either the sub data bus SDB2 or SDB1 begins to change into the ground potential VSS. The operation identical to the above-described operation is subsequently carried out.

As has been described above, the equalize voltage or potential applied to each of the pair of sub data buses is set to the center between the potentials on the power source potential side and the ground potential side, of the sub data buses. Therefore, the data reading rate and the time required to equalize the potentials on the data buses with each other can be improved.

Having now fully described the invention, it will be apparent to those skilled in the art that many changes and modifications can be made without departing from the spirit or scope of the invention as set forth herein.

What is claimed is:

1. A data reading circuit comprising:
   a pair of data buses supplied with complementary potential respectively;
   a first reference voltage source having a first potential;
   a second reference voltage source having a second potential;
   a first switch connected to said first reference voltage source and said pair of data buses and responsive to a first clamping signal to electrically connect said first reference voltage source to said pair of data buses; and
   a second switch connected to said second reference voltage source and said pair of data buses and responsive to a second clamping signal to electrically connect said second reference voltage source to said pair of data buses.

2. A data reading circuit according to claim 1, wherein said first switch comprises:
   a first control terminal supplied with a first control signal;
   a first transistor having a control electrode connected to said first control terminal, a first electrode connected to said first reference voltage source and a second electrode connected to one of said pair of data buses; and
   a second transistor having a control electrode connected to said first control terminal, a third electrode connected to said first reference voltage source and a fourth electrode connected to the other of said pair of data buses.

3. A data reading circuit according to claim 1, wherein said second switch comprises:
   a second control terminal supplied with a second control signal;
   a third transistor having a control electrode connected to said second control terminal, a fifth electrode connected to said second reference voltage source and a sixth electrode connected to one of said pair of data buses; and
   a fourth transistor having a control electrode connected to said second control terminal, a seventh electrode connected to said second reference voltage source and an eighth electrode connected to the other of said pair of data buses.

4. A data reading circuit according to claim 1 wherein said first potential is a power source potential.

5. A data reading circuit according to claim 4, wherein the second potential is a ground potential.

6. A data reading circuit according to claim 1, wherein said second potential is a ground potential.

7. A data reading circuit, comprising:
a plurality of word lines;
a pair of complementary bit lines intersecting said plurality of word lines;
a pair of complementary data buses corresponding to said pair of bit lines;
a plurality of memory cells respectively provided at positions where said pairs of word lines and said pair of complementary bit lines intersect respectively, said memory cells having predetermined data stored therein;
a column switch connected between said pair of bit lines and said pair of data buses and having a column signal input terminal supplied with a column signal, said column switch being responsive to activation of the column signal to electrically connect said pair of bit lines to said pair of data buses;
a first reference voltage source having a first potential;
a second reference voltage source having a second potential;
an equalizing circuit connected to said first reference voltage source and said pair of data buses and having an equalize signal input terminal supplied with an equalize signal, said equalizing circuit being responsive to activation of the equalize signal to electrically connect said first reference voltage source and said pair of data buses and to electrically connect one of said pair of data buses to the other thereof; and
a clamping circuit for alternatively clamping the first potential or the second potential on each of said pair of data buses., said clamping circuit connected to said first reference voltage source, said second reference voltage source and said pair of data buses and having a first clamping signal input terminal supplied with a first clamping signal and a second clamping signal input terminal supplied with a second clamping signal, said clamping circuit being responsive to activation of the first clamping signal to electrically connect said first reference voltage source to said pair of data buses and responsive to activation of the second clamping signal to electrically connect said second reference voltage source to said pair of data buses.

8. A data reading circuit according to claim 7, wherein said first potential is a power source potential.

9. A data reading circuit according to claim 8, wherein the second potential is a ground potential.

10. A data reading circuit according to claim 7, wherein said clamping circuit comprises:
a first node connected to one of said pair of data buses;
a second node connected to the other of said pair of data buses;
a first switch connected to said first clamping signal input terminal, said first reference voltage source and said first node and responsive to said first clamping signal to electrically connect said first reference voltage source to said first node;
a second switch connected to said first clamping signal input terminal, said first reference voltage source and said second node and responsive to said first clamping signal to electrically connect said first reference voltage source to said second node;
a third switch connected to said second clamping signal input terminal, said second reference voltage source and said first node and responsive to said second clamping signal to electrically connect said second reference voltage source to said first node; and
a fourth switch connected to said second clamping signal input terminal, said second reference voltage source and said second node and responsive to said second clamping signal to electrically connect said second reference voltage source to said second node.

11. A data reading circuit according to claim 10, wherein said first through fourth switches are MOS transistors.

12. A data reading circuit according to claim 11, wherein said first through fourth switches are N-type MOS transistors.

13. A data reading circuit according to claim 7, wherein
during a first time period, an activated signal is supplied to said equalize signal input terminal and said first and second clamping signal input terminals and a non-activated signal is supplied to said column signal input terminal, and
during a second time period subsequent to said first period, an activated signal is supplied to said column signal input terminal and said first clamping signal input terminal and a non-activated signal is supplied to said equalize signal input terminal and said second clamping signal input terminal.

14. A data reading circuit according to claim 7, wherein said second potential is a ground potential.

15. A data reading circuit comprising:
a pair of data lines supplied with complementary potential levels respectively;
a first reference voltage source having a first potential;
a second reference voltage source having a second potential;
a first clamping signal input terminal supplied with a first clamping signal;
a second clamping signal input terminal supplied with a second clamping signal;
a first node connected to one of said pair of data lines;
a second node connected to the other of said pair of data lines;
a first switch connected to said first clamping signal input terminal, said first reference voltage source and said first node and responsive to said first clamping signal to electrically connect said first reference voltage source to said first node;
a second switch connected to said first clamping signal input terminal, said first reference voltage source and said second node and responsive to said first clamping signal to electrically connect said first reference voltage source to said second node;
a third switch connected to said second clamping signal input terminal, said second reference voltage source and said first node and responsive to said second clamping signal to electrically connect said second reference voltage source to said first node; and a fourth switch connected to said second clamping signal input terminal, said second reference voltage source and said second node and responsive to said second clamping signal to electrically connect said second reference voltage source to said second node.

16. A data reading circuit according to claim 15, wherein said first through fourth switches are MOS transistors.

17. A data reading circuit according to claim 16, wherein said first through fourth switches are N-type MOS transistors.

18. A data reading circuit according to claim 15, wherein said second potential is a ground potential.

19. A data reading circuit according to claim 15, wherein said first potential is a power source potential.

20. A data reading circuit according to claim 19, wherein the second potential is a ground potential.

* * * * *